US012715392B2

(12) United States Patent
Carraro et al.

(10) Patent No.: US 12,715,392 B2
(45) Date of Patent: Aug. 25, 2026

(54) PRESSURE SENSING SYSTEM AND SEAT CUSHION HAVING THE PRESSURE SENSING SYSTEM

(71) Applicant: Magna Seating Inc., Aurora (CA)

(72) Inventors: Bruno D. Carraro, Ferndale, MI (US); Eric Kozlowski, Oakland Township, MI (US); Rene Chauvin, Desbarats (CA); Daniel C. Wyatt, St. Clair Shores, MI (US)

(73) Assignee: MAGNA SEATING INC., Aurora (CA)

( * ) Notice: Subject to any disclaimer, the term of this patent is extended or adjusted under 35 U.S.C. 154(b) by 113 days.

(21) Appl. No.: 18/795,422

(22) Filed: Aug. 6, 2024

(65) Prior Publication Data

US 2024/0391415 A1 Nov. 28, 2024

Related U.S. Application Data

(62) Division of application No. 16/629,179, filed as application No. PCT/US2018/041188 on Jul. 9, 2018, now Pat. No. 12,083,989.

(Continued)

(51) Int. Cl.
*B60R 22/48* (2006.01)
*B29C 44/12* (2006.01)
(Continued)

(52) U.S. Cl.
CPC .......... *B60R 22/48* (2013.01); *B29C 44/1266* (2013.01); *B29C 44/583* (2013.01);
(Continued)

(58) Field of Classification Search
CPC ..................................................... B60R 22/48
See application file for complete search history.

(56) References Cited

U.S. PATENT DOCUMENTS 5,028,355 A * 7/1991 Cope ...................... C08K 5/315 252/511
5,060,527 A 10/1991 Burgess
(Continued)

FOREIGN PATENT DOCUMENTS

AU 2007242027 A1 * 11/2007 ............. G01L 1/146
DE 102011056371 A1 * 6/2013 ......... G01R 31/2808
(Continued)

*Primary Examiner* — Jean Paul Cass
(74) *Attorney, Agent, or Firm* — Miller Canfield

(57) ABSTRACT

A pressure sensing system, seat cushion incorporating the pressure sensing system, and method of sensing a weight group associated with an occupant of an automotive seat are described. The pressure sensing system includes a layer of an electrically conductive foam and a flexible printed circuit that includes a flexible substrate and N horizontal sensing wires and M vertical sensing wires securely placed on a top surface of the flexible substrate. The horizontal sensing wires intersect with the vertical sensing wires and form (N×M) intersections. The layer of an electrically conductive foam is placed on top of the N horizontal sensing wires and the M vertical sensing wires. When a pressure is applied to the layer of the electrically conductive foam, each intersection generates in real time an electric flux density value to reflect a degree of a compression caused by the pressure to a corresponding point of the electrically conductive foam.

6 Claims, 15 Drawing Sheets

Related U.S. Application Data

(60) Provisional application No. 62/529,517, filed on Jul. 7, 2017.

(51) Int. Cl.

| | |
|---|---|
| ***B29C 44/58*** | (2006.01) |
| ***B29C 45/14*** | (2006.01) |
| ***B29C 45/26*** | (2006.01) |
| ***B29K 75/00*** | (2006.01) |
| ***B29K 105/04*** | (2006.01) |
| ***B29L 31/00*** | (2006.01) |
| ***B29L 31/30*** | (2006.01) |
| ***B29L 31/34*** | (2006.01) |
| ***B60N 2/00*** | (2006.01) |
| ***B60R 21/01*** | (2006.01) |
| ***G01L 1/20*** | (2006.01) |
| ***H05K 1/02*** | (2006.01) |
| ***H05K 1/03*** | (2006.01) |

(52) U.S. Cl.

CPC ........ *B29C 45/14065* (2013.01); *B29C 45/26* (2013.01); *B60N 2/002* (2013.01); *B60N 2/0025* (2023.08); *B60N 2/0033* (2023.08); *B60R 21/01* (2013.01); *G01L 1/205* (2013.01); *H05K 1/0296* (2013.01); *H05K 1/032* (2013.01); *H05K 1/0393* (2013.01); *B29C 2045/14147* (2013.01); *B29K 2075/00* (2013.01); *B29K 2105/04* (2013.01); *B29L 2031/3005* (2013.01); *B29L 2031/3425* (2013.01); *B29L 2031/771* (2013.01); *B60N 2210/40* (2023.08); *B60R 2022/4808* (2013.01); *H05K 2201/10151* (2013.01)

(56) References Cited

U.S. PATENT DOCUMENTS

| | | | | |
|---|---|---|---|---|
| 6,825,765 | B2 | 11/2004 | Stanley et al. | |
| 7,103,460 | B1 * | 9/2006 | Breed | G07C 5/008 706/15 |
| 7,217,891 | B2 | 5/2007 | Fischer et al. | |
| 7,434,481 | B2 | 10/2008 | Hawes et al. | |
| 8,049,520 | B2 | 11/2011 | Schleeh | |
| 8,285,454 | B2 | 10/2012 | Norton | |
| 8,524,622 | B2 | 9/2013 | Akaike et al. | |
| 9,205,567 | B2 * | 12/2015 | Rose | B25J 19/005 |
| 9,462,978 | B2 | 10/2016 | Yang et al. | |
| 9,625,330 | B2 * | 4/2017 | Park | G01L 1/205 |
| 12,083,989 | B2 * | 9/2024 | Carraro | B60N 2/002 |
| 12,118,449 | B2 * | 10/2024 | Damasio | G06N 3/09 |
| 12,196,626 | B2 * | 1/2025 | Vardoulis | A61B 5/00 |
| 12,292,346 | B2 * | 5/2025 | Wang | A61B 5/02108 |
| 2004/0130442 | A1 * | 7/2004 | Breed | G06V 20/593 340/449 |
| 2005/0192727 | A1 * | 9/2005 | Shostak | G07C 5/0808 701/1 |
| 2005/0273218 | A1 * | 12/2005 | Breed | G06K 7/10178 701/2 |
| 2006/0025897 | A1 * | 2/2006 | Shostak | G06K 19/0717 701/1 |
| 2012/0223723 | A1 | 9/2012 | Mamigonians | |
| 2013/0238129 | A1 * | 9/2013 | Rose | B25J 19/0029 700/258 |
| 2014/0097651 | A1 | 4/2014 | Fortune et al. | |
| 2014/0290389 | A1 | 10/2014 | Nii et al. | |
| 2015/0128354 | A1 | 5/2015 | Greenstein et al. | |
| 2016/0018275 | A1 | 1/2016 | Kaneko et al. | |
| 2016/0033343 | A1 * | 2/2016 | Park | G01L 1/146 73/862.046 |
| 2017/0068342 | A1 * | 3/2017 | Zimmerman | G06F 3/0414 |
| 2019/0381860 | A1 * | 12/2019 | Credo | G08B 5/00 |
| 2022/0087617 | A1 * | 3/2022 | Main | A61B 5/7267 |
| 2022/0234540 | A1 * | 7/2022 | Barnes | B60N 2/2812 |

FOREIGN PATENT DOCUMENTS

| | | | | |
|---|---|---|---|---|
| EP | 0562820 | A1 | 9/1993 | |
| EP | 1712403 | A1 * | 10/2006 | B60R 21/10152 |
| JP | H0938982 | A * | 2/1997 | B29C 45/73 |
| KR | 10-2015-0146207 | A | 12/2015 | |
| WO | WO1999063314 | A1 | 12/1999 | |

* cited by examiner

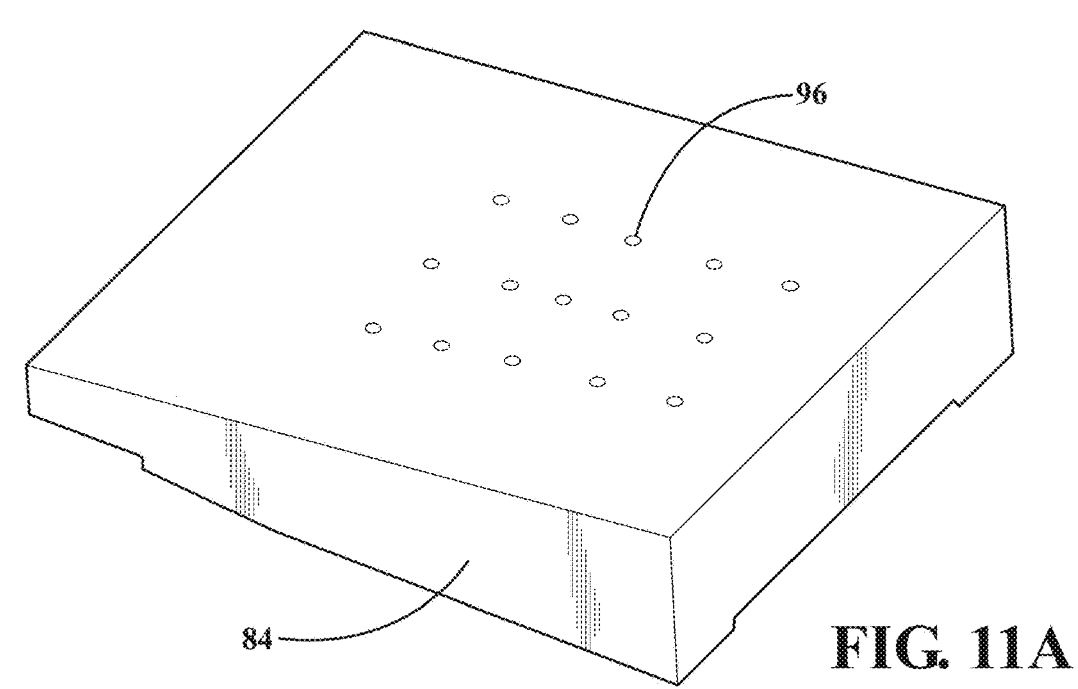
FIG. 11A
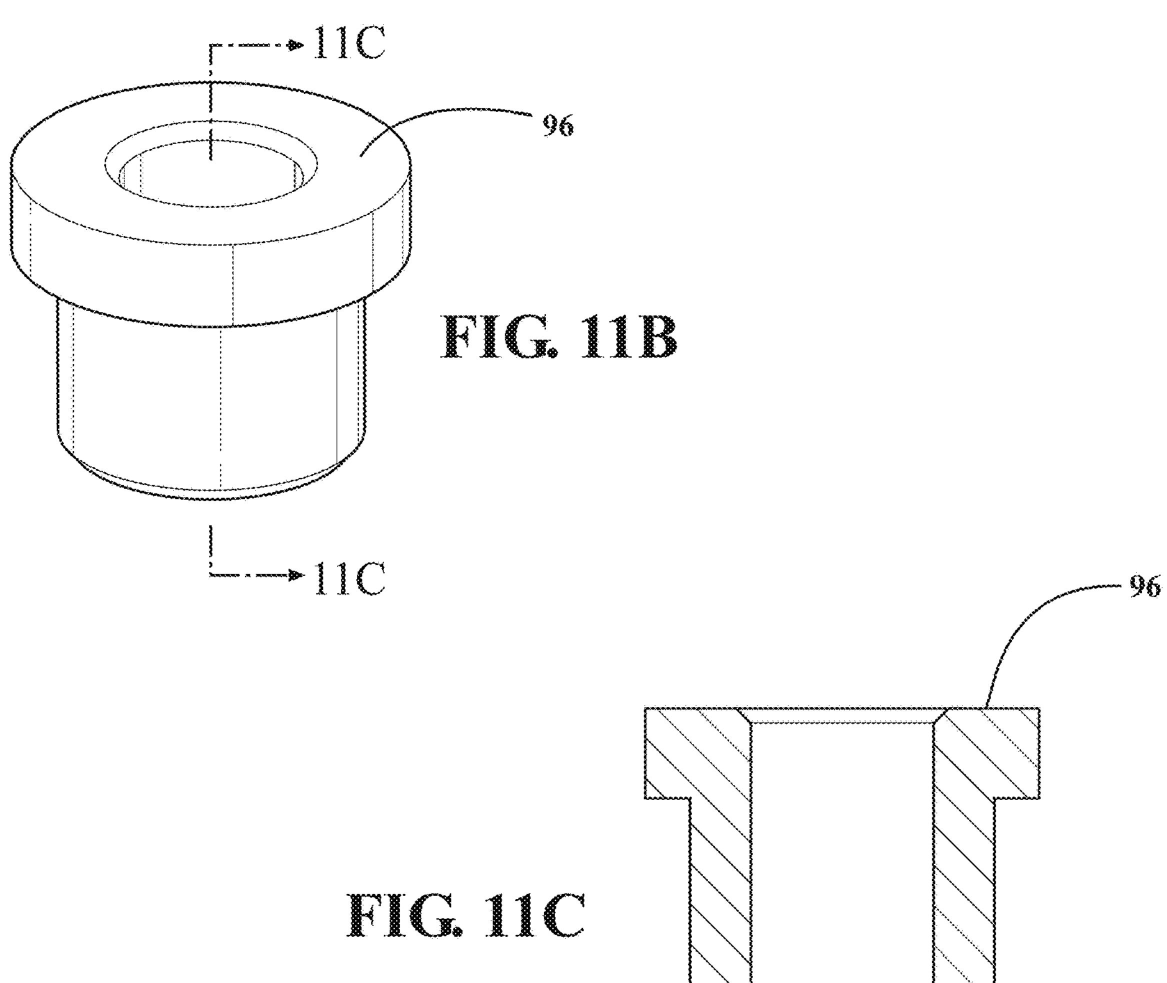
FIG. 11B
FIG. 11C

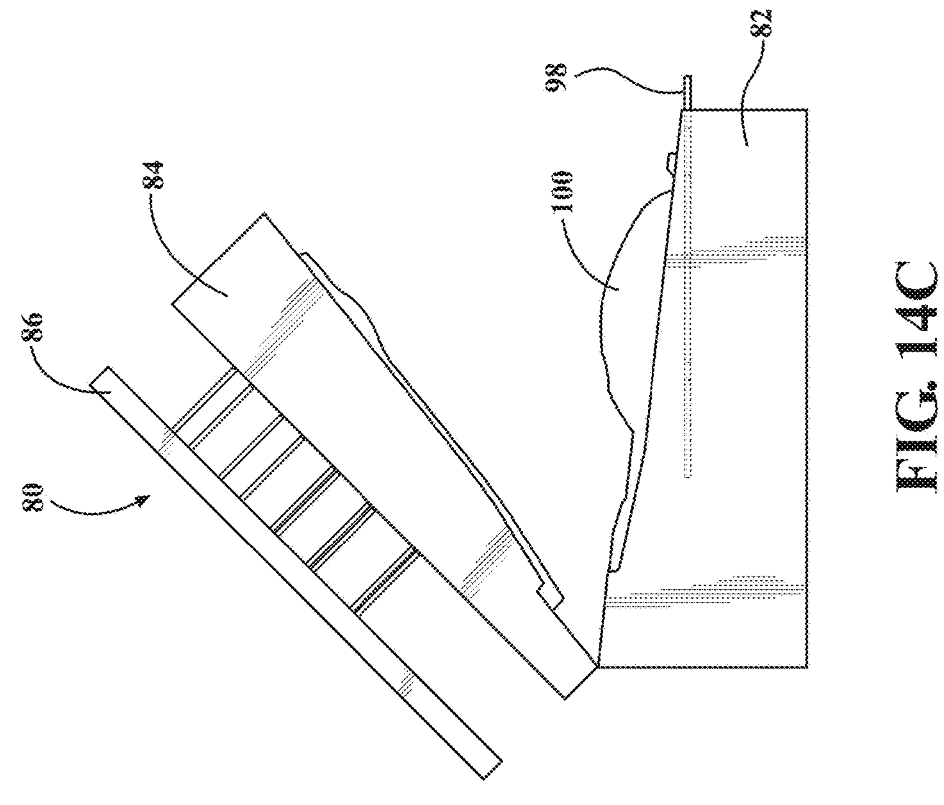
FIG. 14C
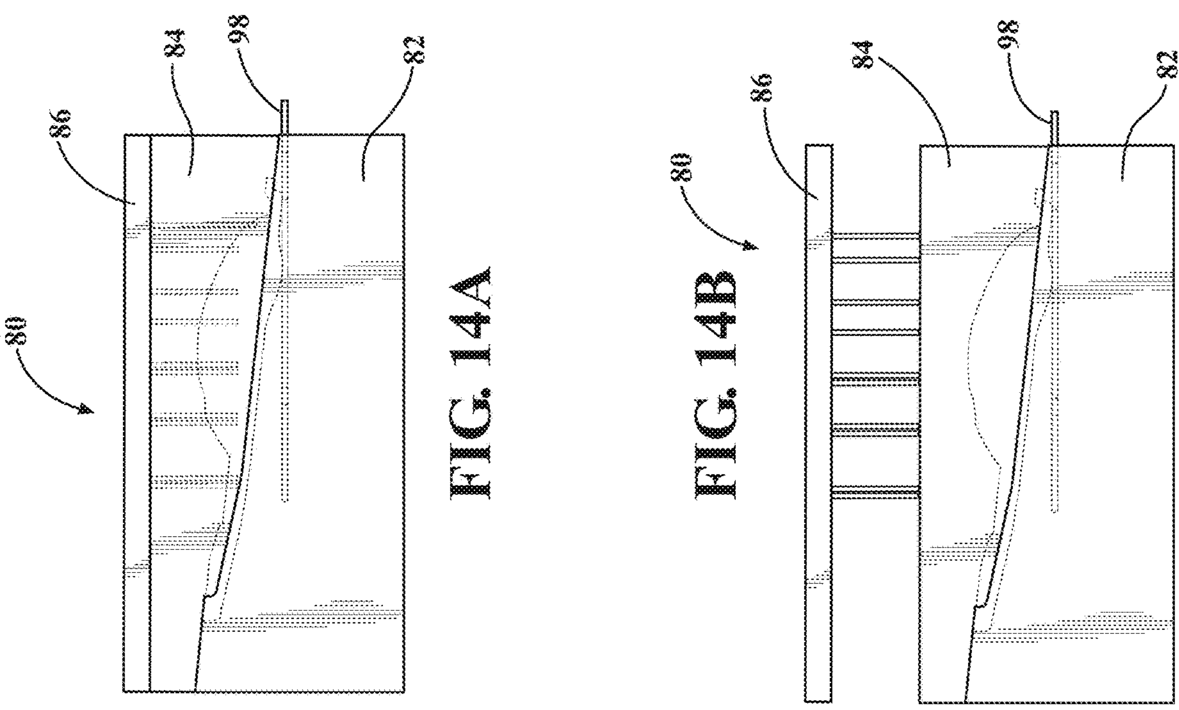
FIG. 14A
FIG. 14B

PRESSURE SENSING SYSTEM AND SEAT CUSHION HAVING THE PRESSURE SENSING SYSTEM

CROSS-REFERENCE TO RELATED APPLICATIONS

This application is a divisional application of U.S. patent application Ser. No. 16/629,179 filed Jan. 7, 2020 and entitled "Pressure Sensing System and Seat Cushion Having The Pressure Sensing System", which in turn claims priority to U.S. provisional application No. 62/529,517, filed on Jul. 7, 2017, entitled "Seat with Permittivity Sensor and Conductive Foam Pad", which are incorporated herein by reference.

FIELD OF THE INVENTION

The present application relates generally to pressure sensing, and more particularly relates to a pressure sensing system, a seat cushion incorporating the pressure sensing system, and a method of sensing a weight group associated with an occupant of an automotive seat.

BACKGROUND

An occupant of a vehicle seat is classified according to Federal Motor Vehicle Safety Standard 208 (FMVSS 208). Sensing technologies are commonly used to determine the weight of the occupant for classification. Based on the sensed weight of the vehicle occupant, deployment of an air bag is enabled or disabled. However, the sensed weight may be unreliable. The sensed weight of the occupant may change when an occupant shifts or changes the manner of sitting. For example, when the occupant sits out of a normal position, the sensed weight may not reflect the true weight of the occupant.

As well, due to the size of existing sensors within sensing systems, the number of sensors that can be placed in an area of a vehicle seat is limited. As such, some of the sensing systems used on a vehicle seat only provide data from limited points on the seat and thus the sensing resolution is low, which leads to ineffective measurement of the vehicle occupant's weight.

SUMMARY OF THE INVENTION

A pressure sensing system includes a layer of an electrically conductive foam and a flexible printed circuit where a plurality of horizontal sensing wires intersect with a plurality of vertical sensing wires to form a plurality of intersections. The layer of an electrically conductive foam is placed on top of the horizontal sensing wires and the vertical sensing wires. When a pressure is applied to the layer of the electrically conductive foam, each intersection generates in real time an electric flux density value to reflect a degree of a compression caused by the pressure to a corresponding point of the electrically conductive foam. As such, each intersection serves as a pressure sensor. The intersection has a much smaller size than the existing sensors, and the number of the intersections can be conveniently increased by adding additional horizontal sensing wires and/or vertical sensing wires. Therefore, the pressure sensing system has an improved resolution in the area.

As well, by insert-molding a mat, such as sensors comprising a flexible printed circuit, inside a seat cushion foam, the sensors form an integrated part of the seat cushion foam. When an occupant sits on the seat cushion foam, relative movement between the flexible printed circuit and the cushion foam is eliminated or substantially reduced. As such, mechanical stresses, creasing, and excessive aging of the flexible printed circuit is reduced.

According to an aspect of the present application, there is provided a pressure sensing system. The pressure sensing system comprises a flexible printed circuit comprising a flexible substrate, N horizontal sensing wires and M vertical sensing wires securely placed on a top surface of the flexible substrate, wherein the horizontal sensing wires intersect with the vertical sensing wires and form (N×M) intersections. The pressure sensory system also comprises a layer of an electrically conductive foam placed on top of the N horizontal sensing wires and the M vertical sensing wires. When a pressure is applied to the layer of the electrically conductive foam, each intersection generates in real time an electric flux density value to reflect a degree of a compression caused by the pressure to a corresponding point of the electrically conductive foam.

According to another aspect of the present application, there is provided a seat cushion, which comprises a polyurethane (PU) foam pad and a pressure sensing system placed on top of the PU foam pad. The pressure sensing system comprises: a flexible printed circuit comprising: a flexible substrate; and N horizontal sensing wires and M vertical sensing wires securely placed on a top surface of the flexible substrate, wherein the horizontal sensing wires intersect with the vertical sensing wires and form (N×M) intersections; and a layer of an electrically conductive foam placed on top of the N horizontal sensing wires and the M vertical sensing wires. When an occupant sits on the seat cushion, a pressure is applied to the layer of the electrically conductive foam, each intersection generates in real time an electric flux density value to reflect a degree of a compression caused by the pressure to a corresponding point of the electrically conductive foam.

According to another aspect of the present application, there is provided a method for sensing a weight group associated with an occupant of an automotive seat. The method comprises: receiving, by a processor, (N×M) electric flux density values from (N×M) intersections formed by N horizontal sensing wires and M vertical sensing wires of a flexible substrate placed on the automotive seat, each electric flux density value reflecting a degree of compression caused by a pressure to a corresponding point of an electrically conductive foam placed on the flexible substrate; determining, by the processor, a weight group associated with the occupant according to the (N×M) electric flux density values; and sending, by the processor, the weight group associated with the occupant to an occupant restraint controller.

According to another aspect of the present application, there is provided an insert-molding tool for manufacturing a seat cushion. The tool comprises: a bowl having a body portion and a first plurality of side walls; a plurality of pins on a top surface of the body portion of the bowl for securely receiving a mat; a lid having a body portion and a second plurality of side walls, the body portion of the lid having a plurality of through holes; and a moving plate having a plate base and a plurality of clamping pins extended downwardly from a bottom surface of the plate base. The plurality of clamping pins is configured to penetrate through the corresponding through holes and to engage the corresponding pins of the bowl and wherein when a bottom surface of the plate base is placed on a top surface of the lid such that the lid engages the lid to form a liquid leakage-proof space.

According to another aspect of the present application, there is provided a method for insert-molding a mat inside a seat cushion foam. The method comprises: securely placing the mat at a predetermined position and at a predetermined height above a top surface of a bowl; forming a liquid leakage-proof space between the top surface of the bowl and a lid such that the mat is orientated within the space; and injecting liquid foam into the space.

BRIEF DESCRIPTION OF THE DRAWINGS

Reference will now be made, by way of example, to the accompanying drawings which show example embodiments of the present application, and in which:

FIG. 11A is a perspective view of the lid in FIG. 10A with bushings;

FIG. 11B is a perspective enlarged view of a bushing from FIG. 11A;

FIG. 11C is a cross-sectional view of the bushing from FIG. 11B;

FIG. 14A is a side view of the tool from FIG. 8, showing the lid of the tool in a closed position and the plate engaged with the lid;

FIG. 14B is a side view of the tool from FIG. 8, showing the lid in the closed position and the moving plate disengaged from the bowl; and FIG. 14C is a side view of the tool from FIG. 8, showing the lid in an open position.

Similar reference numerals may have been used in different figures to denote similar components.

DETAILED DESCRIPTION OF THE PREFERRED EMBODIMENTS

Figure 1:
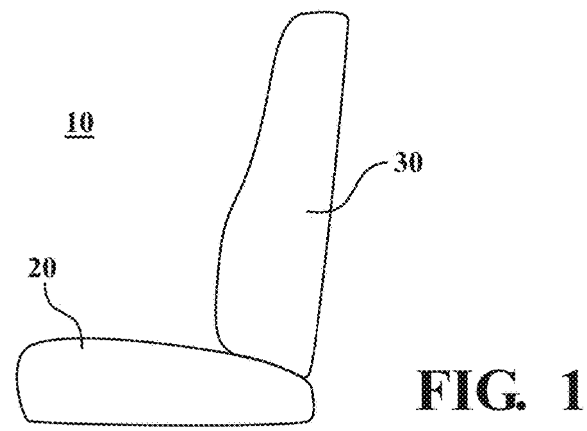
FIG. 1 a schematic diagram of a vehicle seat.

FIG. 1 illustrates a seat 10. The seat 10 may be a front seat or a rear seat of an automobile or other motor vehicle. The seat 10 includes a seat cushion 20 and a seat back 30. The cushion 20 may include a foam pad, such as a thermally conductive foam pad. A portion of the foam pad may be filled with conductive substances, such as electrically conductive substances or thermally conductive substances. Examples of such foam pads are disclosed in provisional application Nos. 62/269,526, 62/331,518, and 62/475,956. The contents of these provisional applications are incorporated herein by reference.

In some examples, the seat cushion 20 may contain a permittivity sensor and an electrically conductive foam pad for sensing the weight of an occupant of the seat 10 and weight distribution of the occupant on the seat cushion 20. The sensed weight may be used to classify the occupant according to the Federal Motor Vehicle Safety Standard 208 (FMVSS 208), which regulates automotive occupant crash protection in the United States, and to identify position changes of the occupant on the seat cushion 20 over time.

Figure 2:
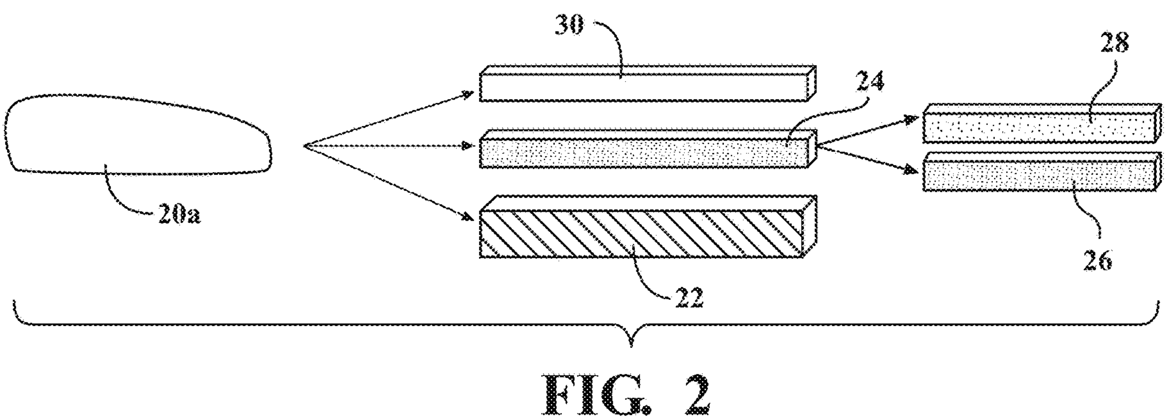
FIG. 2 is a schematic diagram of a seat cushion of the vehicle seat in FIG. 1, according to an embodiment of the present disclosure.

In this regard, FIG. 2 illustrates an exemplary construction of a seat cushion 20*a*. The seat cushion 20*a* includes a polyurethane (PU) foam pad 22, a pressure sensing system 24 placed on top of the PU foam pad 22 and a PU foam slab 30 placed on top of the pressure sensing system 24. In some examples, the pressure sensing system 24 may be a permittivity sensor.

Figure 3:
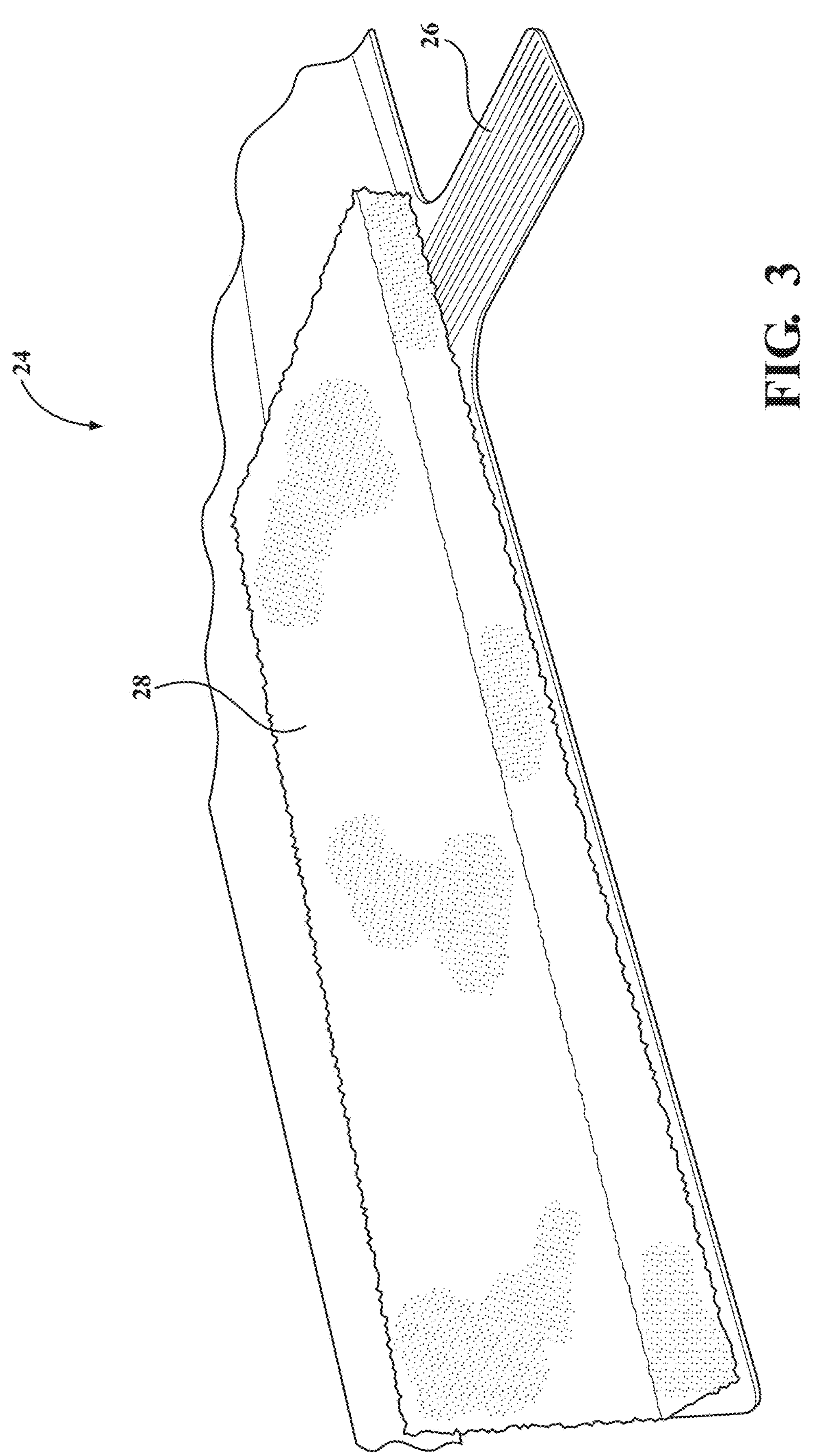
FIG. 3 is a perspective view of an electrically conductive foam and a flexible printed circuit, according to an embodiment of the present disclosure.

In the example shown in FIG. 2, the pressure sensing system 24 includes a flexible printed circuit 26 and a layer of an electrically conductive foam 28. The flexible printed circuit 26 may be a polyethylene terephthalate (PET) or polyimide (PI) flexible printed circuit. The electrically conductive foam 28 may be Vermafoam™. As illustrated in FIG. 3, the electrically conductive foam 28 is placed on top of the flexible printed circuit 26. The electrically conductive foam 28 is operatively connected with the flexible printed circuit 26. The electrically conductive foam 28 may cover the entire area of the flexible printed circuit 26. The flexible printed circuit 26 is placed on and supported by the PU foam pad 30. The polyurethane (PU) foam pad 22, the PU foam slab 30, and the electrically conductive foam 28 mitigate the mechanical stress on the flexible printed circuit 26 when an occupant sits on the seat cushion 20*a*.

Figure 4A:
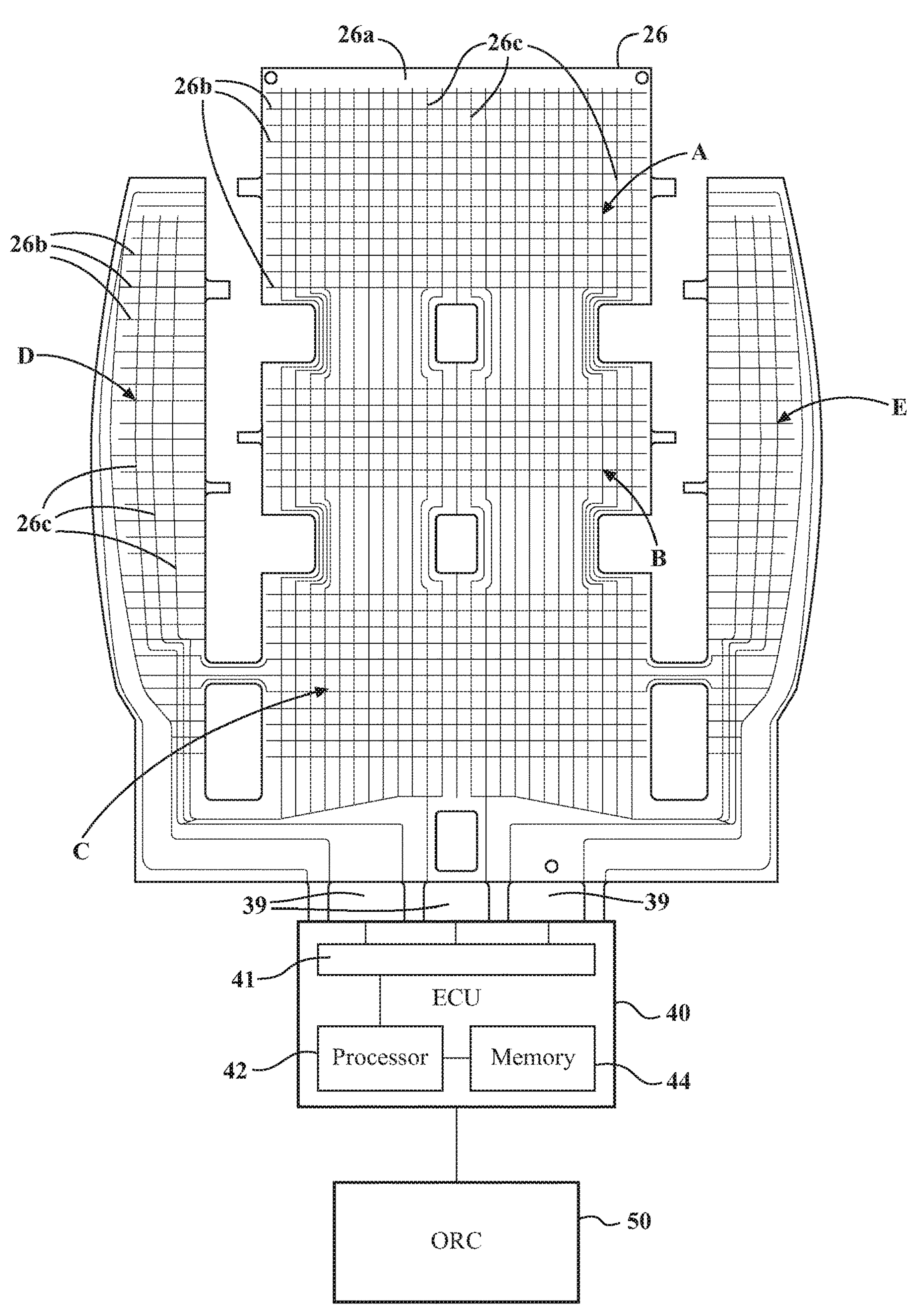
FIG. 4A is a schematic diagram of a pressure sensing system of a vehicle seat, according to an embodiment of present disclosure.
Figure 4B:
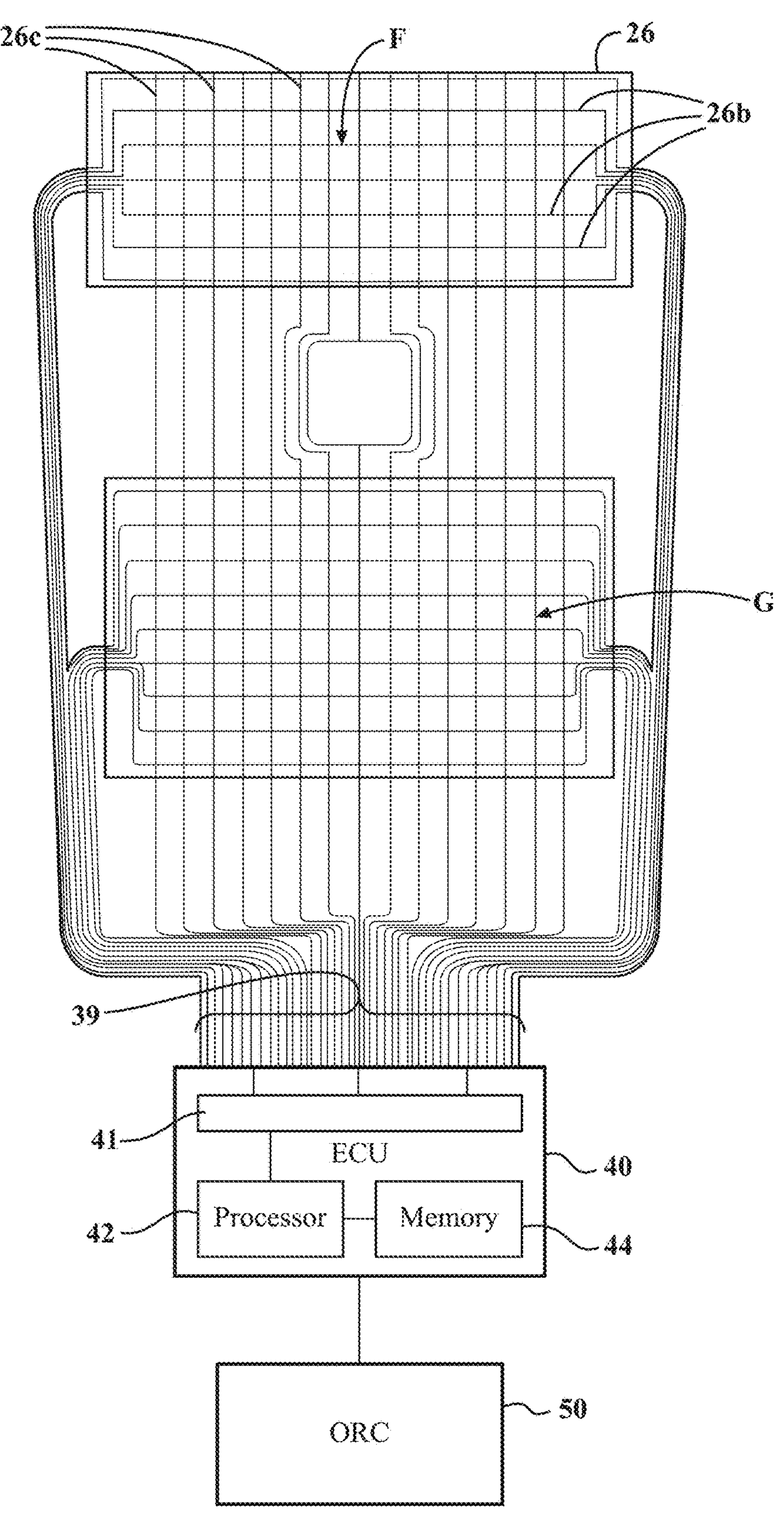
FIG. 4B is a schematic diagram of a pressure sensing system of a vehicle seat, according to another embodiment of present disclosure.

FIGS. 4A and 4B illustrate two pressure sensing systems that may be used in a seat 10. The pressure sensing system 24 in FIG. 4A further includes an electronic control unit 40. The electronic control unit 40 may be separated from the pressure sensing system 24 for receiving and processing the sensed data from the flexible printed circuit 26.

The pressure sensing system 24 generates in real time the sensed data of the pressure applied on the electrically conductive foam 28. When an occupant sits on the seat cushion 20 that includes the pressure sensing system 24 of FIG. 4A, the weight of an occupant of the seat 10 may be measured by the pressure created by the occupant on the electrically conductive foam 28.

The electronic control unit 40 receives and processes in real time the sensed data for determining the weight of the occupant and the weight distribution of the occupant over the seat cushion 20*a*. The electronic control unit 40 may include a receiving circuit 41, a processor 42 and a memory 44. The receiving circuit 41 may be an interface circuit, such as a connector, of the electronic control unit 40 for receiving the sensed data from the output circuit of the flexible printed circuit 26. The receiving circuit 41 receives the sensed data output from the flexible printed circuit 26 and transmits the sensed data to the processor 42 for processing or to the memory 44 for storing. The processor 42 may be a central processing unit (CPU). The memory 44 may include a volatile or non-volatile memory (e.g., a flash memory, a random-access memory (RAM), and/or a read-only memory (ROM)). The electronic control unit 40 may be inserted in the seat cushion 20*a*.

As described above in FIG. 3, the pressure sensing system 24 includes a layer of electrically conductive foam 28 and a flexible printed circuit 26 placed under the electrically conductive foam 28. For clarity, the electrically conductive foam 28 is removed in FIGS. 4A and 4B to clearly illustrate the structure of the flexible printed circuit 26.

In the example shown in FIG. 4A, the flexible printed circuit 26 has a flexible substrate 26*a*, a plurality horizontal sensing wires 26*b* and a plurality of vertical sensing wires 26*c* securely placed on the top surface of the substrate 26*a*. The flexible substrate 26*a* may be a PET or PI substrate. The substrate 26*a* may have any desired profile. For example, the profile of the substrate 26*a* substantially corresponds to the surface profile of the seat cushion 20 of an automotive seat.

The sensing wires 26*b* and 26*c* sense the degree of compression of the electrically conductive foam 28 covered on the sensing wires 26*b* and 26*c*. The sensing wires 26*b* and 26*c* are made of electrically conductive materials, such as copper. The sensing wires 26*b* and 26*c* are operatively connected with the electrically conductive foam 28. The horizontal sensing wires 26*b* intersect with the vertical sensing wires 26*c* at a plurality of intersections. At each intersection, a vertical sensing wire 26*c* is electrically connected with a horizontal sensing wire 26*b*. In an area of the substrate 26*a*, M horizontal sensing wires intersect with N vertical sensing wires, and (N×M) intersections are created in the area. The area may be the entire surface area or a portion of the entire surface area of the seat cushion 20*a*.

The pressure sensing system 24 creates an electric field in the areas surrounding the flexible printed circuit 26. When an occupant sits on the seat cushion 20*a*, the weight of the occupant applies pressure to the seat cushion 20*a*. The pressure is transmitted from the PU foam slab 30 to the electrically conductive foam layer 28. In response, the electrically conductive foam layer 28 is deformed or compressed. Different points of the layer of electrically conductive foam 28 may be subject to different pressures. Accordingly, each point of the layer of electrically conductive foam 28 may be deformed or compressed to a degree in proportion to the pressure applied to the point. As a result, the electrical properties, such as electrical conductivity and permittivity, of each point of the electrically conductive foam 28 are changed in the direction of the compression. The changes in the electrical properties at a point in turn change the electric flux density, and thus change the electric field around the point. The (N×M) intersections on the flexible printed circuit 26 correspond to (N×M) points on the electrically conductive foam 28. Each intersection generates in real time a sensed electric flux density value ("the sensed data") to reflect the change of the electric flux density and the electric field around the intersection. Each value corresponds to the pressure applied to a corresponding point of the electrically conductive foam 28. For example, in an area of the flexible printed circuit 26, five horizontal sensing wires 26*b* and ten vertical sensing wires 26*c* create 50 intersections distributed over the area. When the electrically conductive foam 28 in the area is pressed, 50 sensed electric flux density values at the 50 intersections are generated in the area. In other words, the pressure applied to 50 points of the seat cushion 20*a* is sensed in real time. As such, the degree of changes in the electric flux density and the electric field in the area of the flexible printed circuit 26 reflects the real time weight of the occupant and the real time weight distribution of the occupant in the area. If the area is the entire surface area of the seat cushion 20, the weight of the occupant in the area represents the total weight of the occupant applied to the seat. The changes of the weight distribution of the occupant in an area over time reflects sitting position changes of the occupant over time.

As such, the electrically conductive foam 28 and the flexible printed circuit 26 together form a permittivity sensor for the pressure sensing system 24 to sense the changes of the permittivity of the electrically conductive foam 28 at the points corresponding to the intersections of the horizontal sensing wires and the vertical sensing wires.

By using the sensing array created by the horizontal wires 26*b* and the vertical wires 26*c* to sense the degree of compression of the electrically conductive foam 28, each intersection of the sensing wires serves as a pressure sensing unit of the point. Compared with existing pressure sensing technologies with physical sensors, the sensing resolution of the pressure sensing system 24 is improved in that more sensing units may be created at a selected area by the interactions of the sensing wires. The more horizontal wires 26*b* and the vertical wires 26*c* are used in an area, the more intersections and thus more sensing units are created. As such, higher sensing resolution of the pressure sensing system 24 can be achieved. Additionally, a larger area may be sensed by extending the sensing wires to the areas without substantially increasing the cost.

The sensed data from each intersection is output to the electronic control unit 40 via an output wire 39. An end of the output wire is connected to the intersection and the other end of the output wire extends out from the substrate 26*a*, for example about 160 mm, to form a "tail" for mounting on a connector, such as the receiving circuit 41 of the electronic control unit 40. The processor 42 may then determine a weight group associated with the occupant according to the sensed (N×M) electric flux density values, for example, by comparing the sensed values with the standard electric flux density values associated with different weight groups.

In some examples, the memory 44 of the control unit 40 stores a plurality of predetermined use cases U with respect to a specific seat cushion, such as seat cushion 20*a*, and with respect to a plurality of selected weight groups. The use cases may be generated by the processor 42. A use case U may be a matrix having (N×M) elements of standard electric flux density value at each intersection of the horizontal sensing wires 26*b* and vertical sensing wires 26*c* of the pressure sensing system 24 assembled in a specific cushion in a selected area. A use case is associated with a specific seat cushion and a selected weight group. The weight group may be selected according to the classification of FMVSS 208. For example, at a selected area of a selected seat cushion, an occupant weighing 30 kilograms (kg) is associated with a first use case, and an occupant weighing 60 kg is associated a second use case. Different weight groups in a selected area of a specific seat cushion have different use cases. If a seat cushion includes several areas, the same weight group may have different use cases in different areas of a specific seat cushion.

The processor 42 compares the sensed data with the use cases U to determine the weight group to which an occupant belongs. In some examples, the processor 42 stores the sensed data over time in the memory. The stored sensed data may be used, for example, to determine the changes of position of the occupant on the seat cushion over time.

Figure 5:
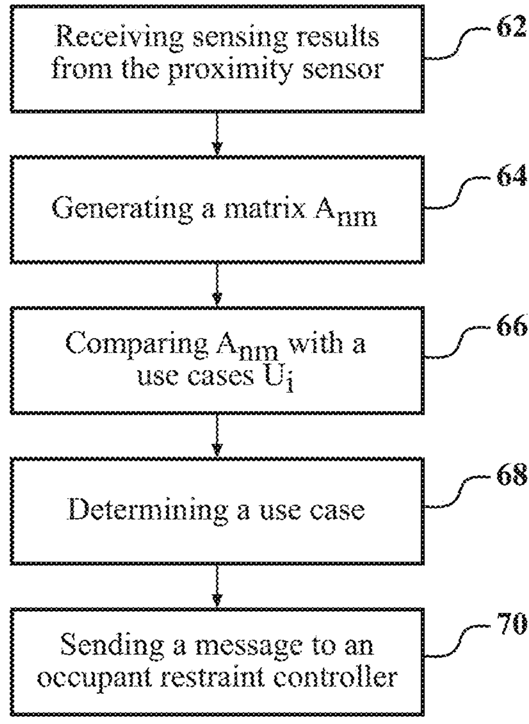
FIG. 5 is a flow chart illustrating steps for determining the weight of an occupant of a vehicle seat.

In some examples, as illustrated in FIG. 5, for an area of the flexible printed circuit 26 with N horizontal sensing wires 26*b* and M vertical sensing wires 26*c*, the processor 42 is configured to receive, from the receiving circuit 41, sensed data from each of the intersection of the sensing wires of the pressure sensing system 24 (step 62) and to arrange the received data in an algebraic matrix S of N rows and M columns (step 64). In some examples, the processor 42 receives sensed data from each of the intersection of the sensing wires at a predetermined rate, such as at every 10-60 milliseconds. Each data of the matrix corresponds to a predetermined position of the seat cushion 20*a*. Accordingly, the use cases U are also arranged in a matrix U having the same dimensions as matrix S, such as N rows and M columns. The element $s_{nm}$ of the matrix S and the element $u_{nm}$ of the matrix U correspond to the same position of the seat cushion 20*a*. For example, $s_{11}$ of the matrix S and the element un of the matrix U both refer to the position where the horizontal sensing wire 1 intersects with the vertical sensing wire 1 on the seat cushion 20*a*. In the example shown in FIG. 4A, the flexible printed circuit 26 or the seat cushion 20*a* contains five matrixes in five selected areas A, B, C, D, and E. In an example in FIG. 7A, the width area A is about 300 mm-320 mm, the length from the outer edge of area A to the outer edge of area B is about 500 mm, and the length from the outer edge of area A to the outer edge of area C is about 780 mm.

The processor 42 may read and compare the matrix $S_{nm}$ with each of the use cases U stored in the memory 44 for an area of the seat cushion 20*a* (step 66). The use case U of the occupant is then determined based the comparison results of the matrix $S_{nm}$ and the use cases U (step 68). For example, the use case U having the minimum error or minimum difference with the matrix S generated from the sensed data is the selected use case of the occupant. The minimum error or difference may be the minimum standard deviation between the data of the matrix $S_{nm}$ and the data of the use cases $U_{nm}$. The weight associated with the selected use case U is then used as the weight of the occupant, such as 60 kg. The processor 42 may then send a message to the occupant restraint controller (step 70), for example at a predetermined rate, for the occupant restraint controller to control the deployment of the air bag. The message may be the weight of the occupant derived from the selected use case U.

The weight group to which the occupant belongs may change if an occupant sits out of the position over time. In this case, the processor 42 may select the maximum weight of the selected weight groups of the occupant as the weight of occupant and send the message including the maximum weight. As such, the sensing system improves the reliability of the sensed weight of the occupant.

The sensing system in FIG. 4B is the same as that in FIG. 4A described above, except the differences in the geometry of the flexible printed circuit 26 and in the number of matrixes or areas contained in the flexible printed circuit 26. The flexible printed circuit 26 in FIG. 4B contains two matrixes in areas F and G.

Figure 6:
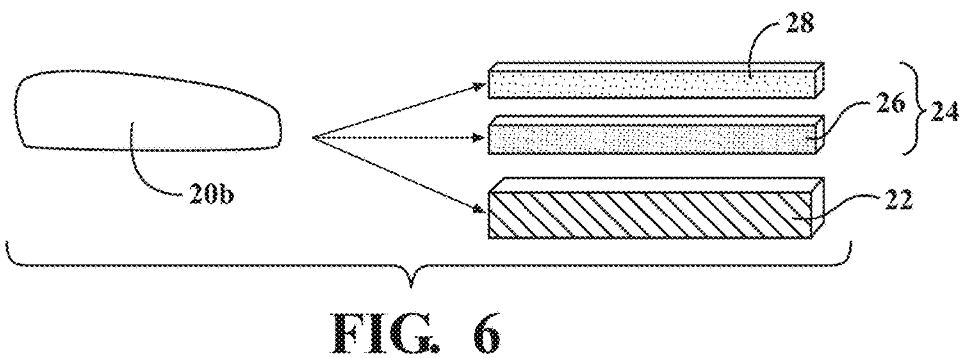
FIG. 6 is a schematic diagram of a seat cushion of the vehicle seat of FIG. 1, according to another embodiment of the present disclosure.

FIG. 6 illustrates another exemplary construction of a seat cushion 20*b*. In FIG. 6, the seat cushion 20*b* includes a polyurethane (PU) foam pad 22 and a pressure sensing system 24 placed on top of the PU foam pad 22. Unlike the seat cushion 20*a*, the seat cushion 20*b* does not include a PU foam slab 30. In the example shown in FIG. 6, the pressure sensing system 24 in the seat cushion 20*b* includes a layer of an electrically conductive foam 28 and a flexible printed circuit 26, same as that in the seat cushion 20*a*. The arrangement of the polyurethane (PU) foam pad 22 and the pressure sensing system 24 are the same as described in seat cushion 20*a*.

In the example shown in FIG. 6, as the PU foam slab 30 in seat cushion 20*a* is not present, the layer of the electrically conductive foam 28 in seat cushion 20*b* may be thicker than that in the seat cushion 20*a* to sufficiently reduce the mechanical stress to the flexible printed circuit 26. Unlike seat cushion 20*a*, when an occupant is seated on the seat cushion 20*b*, the pressure to the seat cushion 20*b* applied by the weight of the occupant is directly transmitted to the layer of the electrically conductive foam 28. As the occupant is directly seated on the surface of the layer of the electrically conductive foam 28 of the seat cushion 20*b*, the sensitivity of the pressure sensing system 24 may be improved, in that the degree of the compression of the layer of the electrically conductive foam 28 may be greater than that of the layer of the electrically conductive foam 28 in seat cushion 20*a*. As a result, the changes in the electric flux density and the electric field in the areas surrounding the flexible printed circuit 26 may become more apparent.

For the same occupant using seat cushion 20*a* and 20*b*, the corresponding variations of the electric flux density and the electric field may be different. As such, to reflect the correct weight of an occupant, the use cases U for the seat cushion 20*a* may be different from the use cases U for the seat cushion 20*b*.

The seat cushions 20*a* and 20*b* in the examples of FIGS. 2 and 6 are A-surface occupant classification systems. The flexible printed circuit 26 is assembled in different layers of the seat cushion 20. The layers of the seat cushion 20 and the assembled flexible printed circuit 26 are encapsulated by a thermoplastic polyurethane elastomer (TPU) sealing cover. Since the flexible printed circuit 26 is a separate layer from the foam layers, when an occupant sits on the seat cushion 20, the pressure on the seat cushion may cause relative movement between the flexible printed circuit 26 and other foam layers. As such, the flexible printed circuit 26 may be abraded by adjacent foam layers. Therefore, the flexible printed circuit 26 assembled in seat cushion 20*a* and 20*b* may be susceptible to failure due to mechanical stresses, creasing, and excessive aging over time. As a result, the seat 10 may lose pressure sensing function.

Figure 7A:
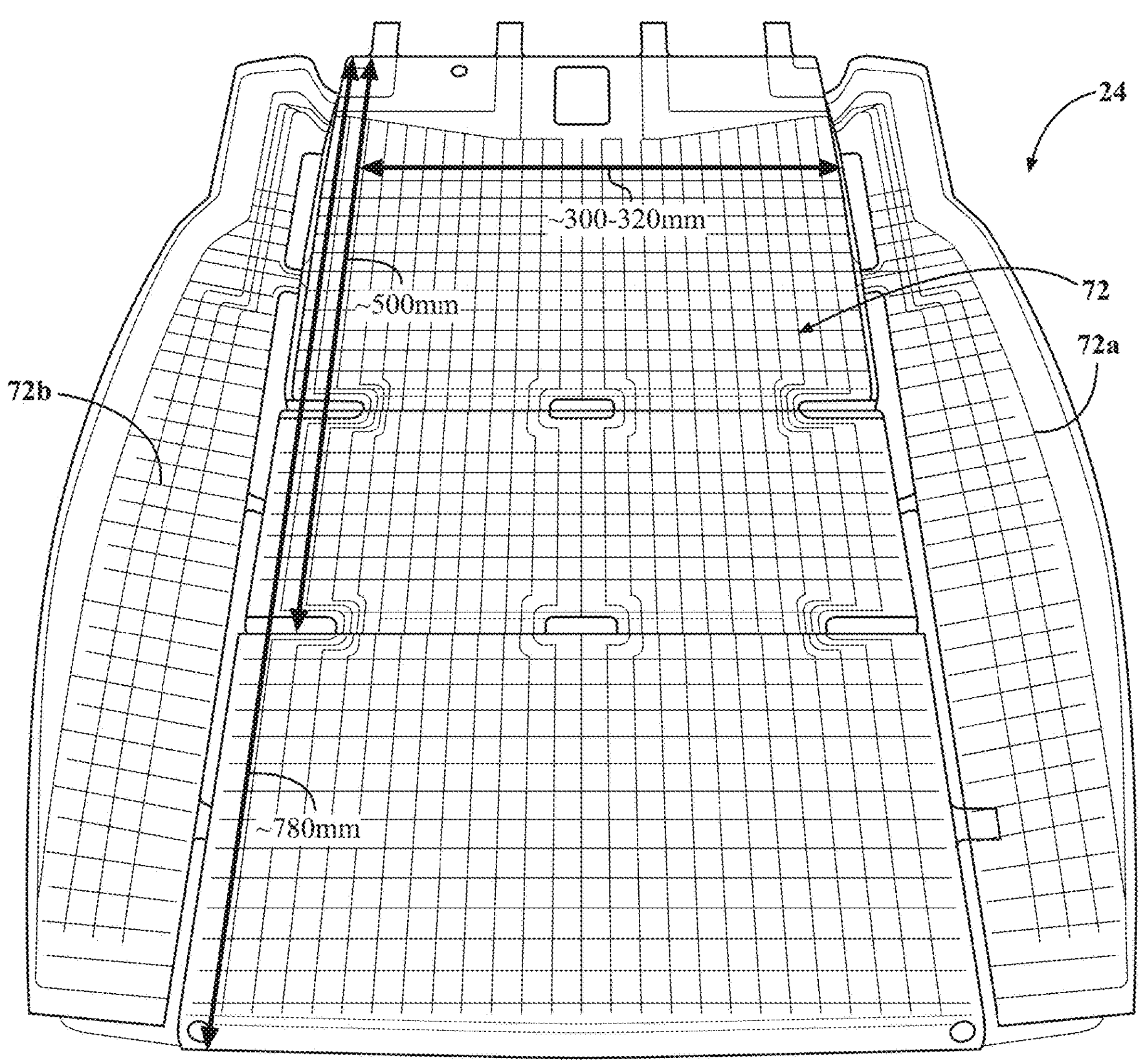
FIG. 7A is a top view of a sensor, according to an embodiment of the present disclosure.
Figure 7B:
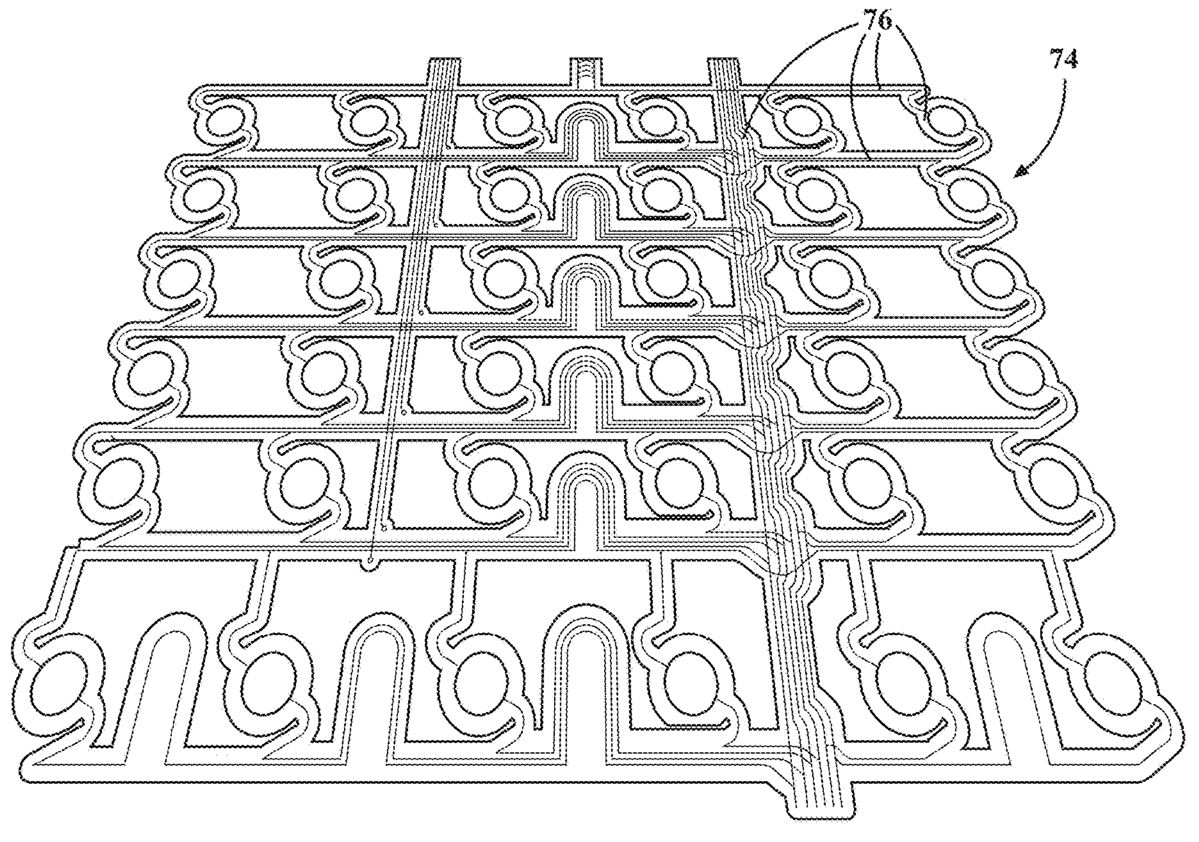
FIG. 7B is a top view of a sensor, according to another embodiment of the present disclosure.

In some examples, the pressure sensing system 24 and other sensors may be insert-molded in a cushion foam, for example the electrically conductive foam 28, to mitigate the risk of mechanical stresses, creasing, and excessive aging. FIGS. 7A and 7B illustrate two exemplary sensors 72 and 74 that may be insert-molded inside a cushion foam.

The sensor 72 may be the pressure sensing system 24 described above. In the example FIG. 7A, the printed flexible circuit of the sensor 72 has no voids. The sensing portion on the bolsters 72*a* and 72*b* may be omitted. The output portion of sensor 72 extends outside from the cushion foam as a "tail" for mounting on the electrical connectors to output the sensed data. The connectors may be Zero insertion force (ZIF) connectors. The output portion may have a width about 70 mm and a length about 160 mm. In addition to the PET flexible printed circuit, the sensor 72 may have a layer of Vermafoam™ on top of the PET flexible printed circuit.

In the example FIG. 7B, the sensor 74 may have the same width, but may have different lengths, such as 780 mm or 500 mm. The output portion of sensor 74 extends outside from the cushion foam as a "tail" for mounting on the electrical connectors to output the sensed data. In some examples, the output portion may have a width about 70 mm and a length about 160 mm. The mat of sensor 74 may be cut using a die and the space in between each sensing unit 76 is about 30 mm×20 mm. In some examples, the edges of the mat are shortened to under 5 mm.

FIGS. 8-14*c* illustrate an exemplary insert-molding tool 80 for injecting a mat, such as a Molex™ mat, inside a cushion foam 100. The mat includes the sensors 72 in FIG. 7A and 74 in FIG. 7B, or sensors formed by any flexible printed circuit 26.

Figure 8:
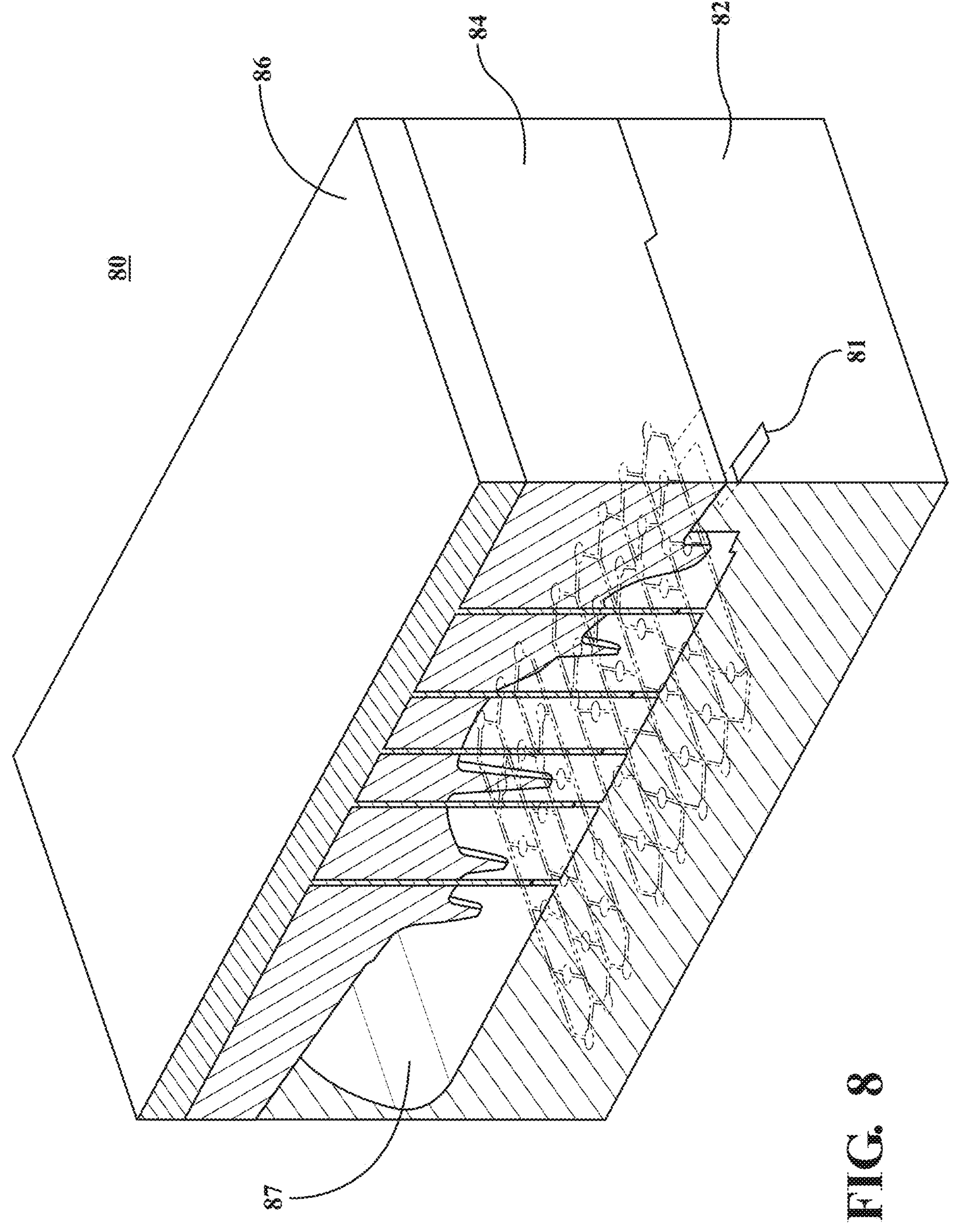
FIG. 8 is a perspective view of a tool for packaging a mat with the front side of the tool being cut off to illustrate the internal structure of the tool, according to an embodiment of the present disclosure.

In the example shown in FIG. 8, the tool 80 includes a bowl 82, a lid 84 and a moving plate 86. A space 87 is formed between the lid 84 and the bowl 82 when the lid 84 is closed on the bowl 82. The profile of the space 87 forms the profile of the cushion foam 100. The profile of the space 87 may be varied according to the profile of the cushion foam 100. The relative positions of "top" and "bottom" referred to below are with respect to the normal use position of tool 80, namely that the lid 84 covers the bowl 82, and the moving plate 86 engages the lid 84.

Figures 9A, 9B:
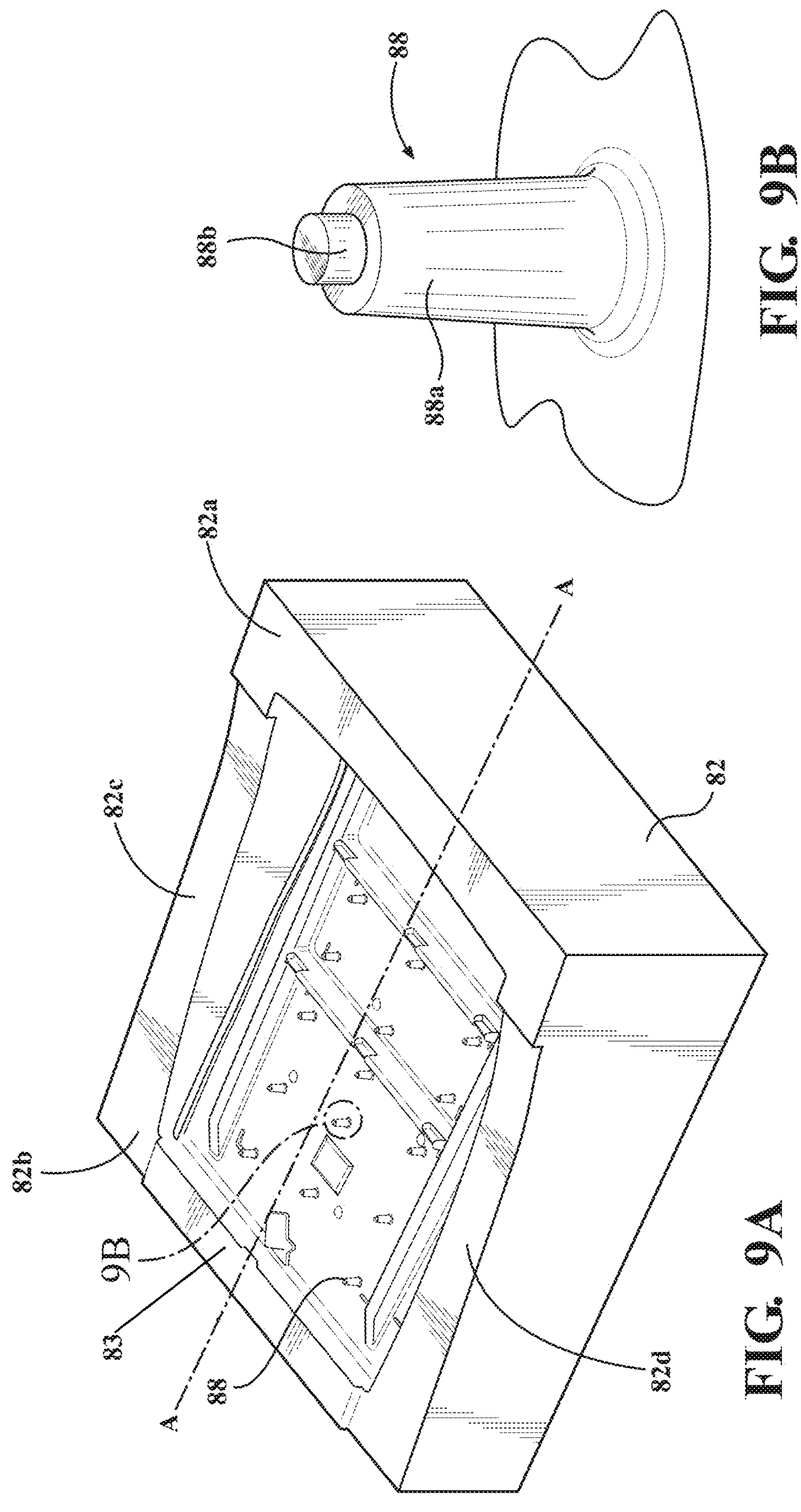
FIG. 9A is a perspective view of a bowl of the tool from FIG. 8.
FIG. 9B is an enlarged perspective view of a pin of the bowl from FIG. 9A.

As shown in FIG. 9A, the bowl 82 has a substantially rectangular body portion and four side walls 82*a*, 82*b*, 82*c* and 82*d* that vertically extend upward from the bottom surface of the body portion of the bowl 82. The side wall 82*a* is higher than the opposed side wall 82*b*, and the side walls 82*c* and 82*d* are connected with the side walls 82*a* and 82*b* and have the substantially the same height at any point along the central axis AA. As such, the height of the side walls 82*c* and 82*d* increases from the end connected to the side wall 82*b* to the end connected to the side wall 82*a*. In the example shown in FIG. 9A, the side wall 82*b* has a protrusion 83 at the central portion of the top surface of the side wall 82*b*; the height of the end portion of the side walls 82*c* and 82*d* close to the side wall 82*a* is substantially the same as the height of the side wall 82*a*.

The bottom surface of the bowl 82 is substantially flat but may include different patterns, such as grooves or protrusions, to form desired patterns on the top surface of a cushion foam.

In FIG. 9A, the bowl 82 includes a plurality of pins 88 on the bottom surface of the body portion for securely receiving a mat 98, such as a Molex™ mat, such as sensors 72 or 74 or sensors including a flexible printed circuit on the fixed positions on the bowl 82. In an example, the bowl 82 has 15 pins 88. As illustrated in FIG. 9B, the pin 88 includes a base 88*a*, such as a conical cylinder base, extending from the bottom surface of the bowl 82 and a top portion 88*b*, such as a top cylinder, extending from the top surface of the base 88*a*. In an example shown in FIG. 9B, the base 88*a* has a height of 15 mm from the bottom surface of the bowl 82 to the top surface of the base 88*a*, and top surface of the base 88*a* has a diameter of 6 mm; the top portion 88*b* has a diameter of 3 mm and a height of 2 mm from the top surface of the base 88*a* to the top surface of the top portion 88*b*. In the example shown in the sensor 24 or 72, the flexible printed circuit 26 has a plurality of through holes in the "dead zones" of the flexible printed circuit 26. The "dead zones" are areas on the flexible printed circuit 26 without any conductive traces or wires. The flexible printed circuit 26 is placed on the pins 88 via the holes in the "dead zones". As such, positions of the sensor units 76 of sensor 72 or positions of the wire intersections of sensor 24 are fixed in relation to the positons of the pins 88. Sensors including flexible printed circuits with different geometries may also be placed around the top portion 88*b* and on the top surface of the base 88*a*, as long as the positions of the sensing units associated with the flexible printed circuit are fixed in relation to the top surface of the bowl 82. In other words, the positions of the sensing units associated with the flexible printed circuit are fixed on the top surface of a seat cushion. As such, use cases $U_i$ for one seat cushion manufactured with the tool 80 may be used in all of the seat cushion manufactured by the same tool.

Figure 10A:
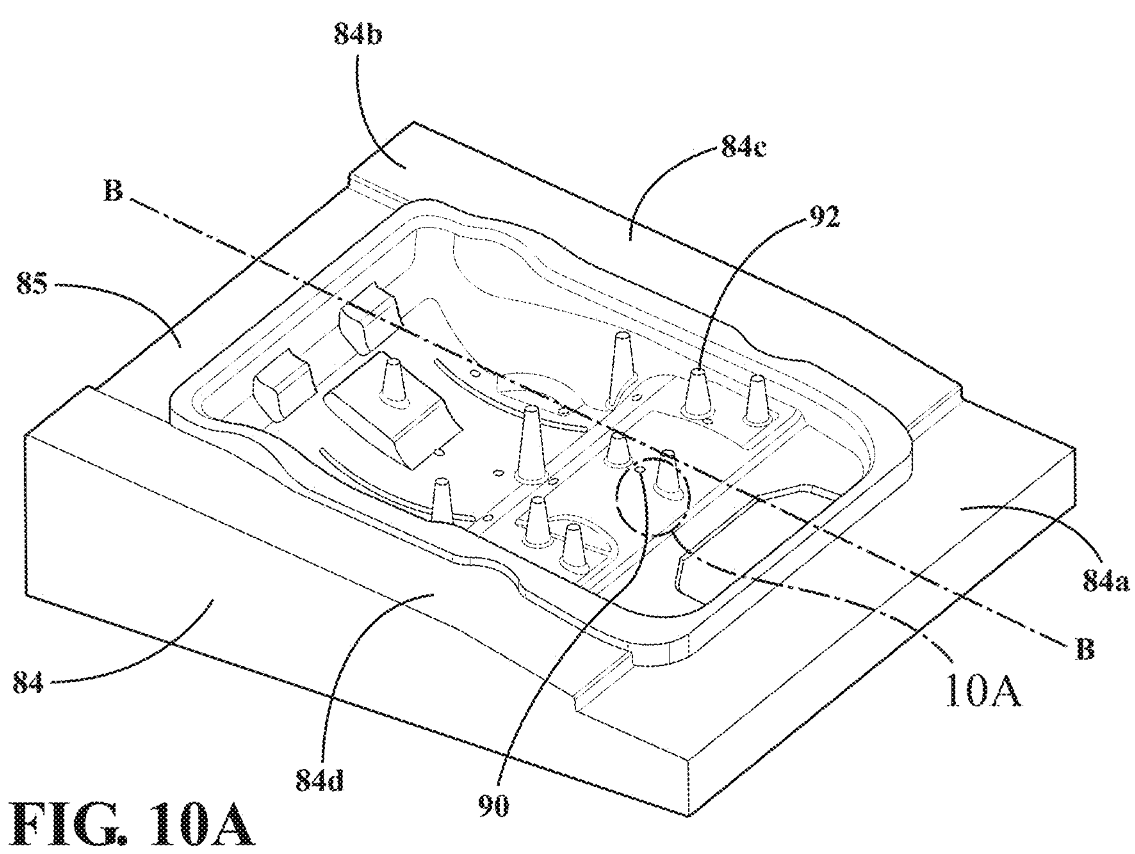
FIG. 10A is a perspective view of a lid of the tool from FIG. 8.
Figure 10B:
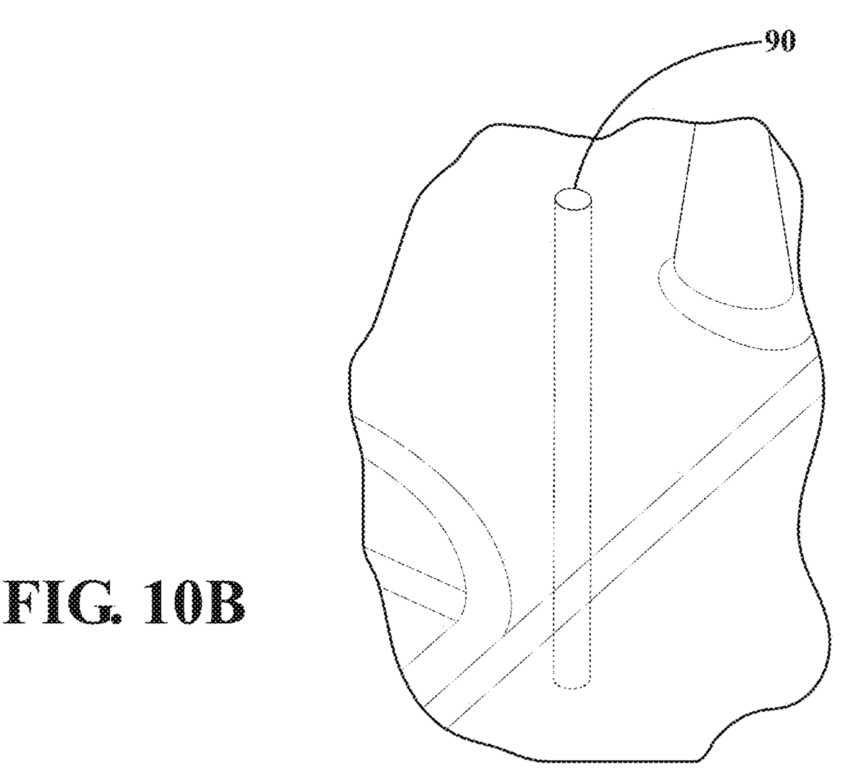
FIG. 10B is an enlarged perspective view of a hole in the lid from FIG. 10A.

FIG. 10A illustrates an exemplary lid 84. The lid 84 has a body portion and four side walls 84*a*, 84*b*, 84*c* and 84*d* extending vertically from the top surface of the body portion of the lid 84. The side wall 84*a* is lower than the opposed side wall 84*b*, and the side walls 84*c* and 84*d* have the substantially the same height at any point along the central axis BB and are connected with the side walls 84*a* and 84*b*. As such, the height of the side walls 84*c* and 84*d* decreases from the end connected to the side wall 84*b* to the end connected to the side wall 84*a*. In the example shown in FIG. 10A, the side wall 84*b* has a groove 85 at the central portion of the top surface of the side wall 84*b* to receive the protrusion 83 of the bowl 82; the height of the end portion of the side walls 84*c* and 84*d* close to the side wall 84*a* is substantially the same as the height of the side wall 84*a*. As such, when the lid 84 is closed on the bowl 82, the top surfaces of side walls 82*a*, 82*b*, 82*c* and 82*d* of the bowl 82 engage the respective top surfaces of side walls 84*a*, 84*b*, 84*c* and 84*d* of the lid 84 to form a liquid leakage-proof space 87 between the bottom surface of the body portion of the bowl 82 and the top surface of the body portion of the lid 84.

In the example shown in FIG. 10A, the top surface of the body portion of the lid 82 has a profile for producing the profile of the bottom surface of a seat cushion when a liquid foam is injected into the space 87. The top surface of the lid 82 may include different patterns, such as grooves or protrusions 99, to form desired patterns on the bottom surface of the cushion foam 100.

The top surface of the body portion of the lid 84 includes a plurality of through holes 90 and a plurality of conical cylinders 92 protruded for the bottom surface of the body portion of lid 84 toward the bowl 82. The through holes 90 may be cylinder through holes. The size of the conical cylinders 92 from the top surface of the body portion of the lid 84 to the end surface of the conical cylinders 92 may be varied. Each of the through holes 90 penetrates through the bottom surface and top surface of the body portion of lid 84. The lid 84 may have the same number of the through holes 90 as the number of the pins 88 of the bowl 82. Each through holes 90 corresponds to a pin 88 on the bottom surface of the body portion of the bowl 82. In the example shown in FIG. 10B, the through hole 90 has a radius of 3.1 mm. The conical cylinders 92 provide trenches in the bottom of the cushion foam 100 to allow assembly and attachment of a trim cover (not shown) via hog-rings, as is well known in the seating industry.

In the example shown in FIG. 11A, each of the through holes 90 may include a bushing 96 inserted in the opening of the through holes 90 on the top surface of the body of the lid 82. The bushing 96 guides and cleans the clamping pins of the moving plate 86 as described below. In the example shown in FIG. 11C, the bushing 96 has an inner diameter about 6 mm between the inner side of the walls of the bushing, an outer diameter about 10 mm between the outer side of the walls of the bottom portion of the bushing, and a length about 10 mm from the bottom surface to the top surface of the bushing. The diameter is about 13 mm between the outer side of the walls of the top portion of the bushing 96.

Figure 12A:
FIG. 12A is a perspective view of a moving plate of the tool from FIG. 8.
Figure 12A:
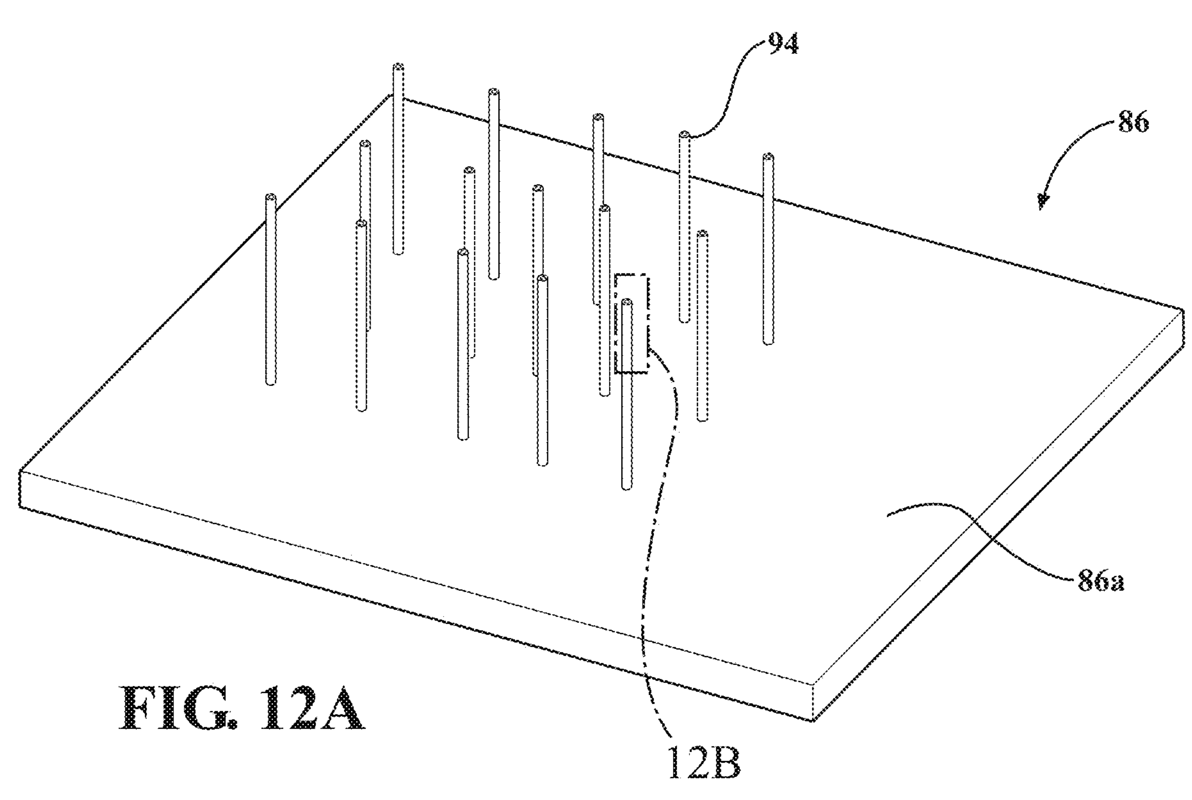
Figure 12B:
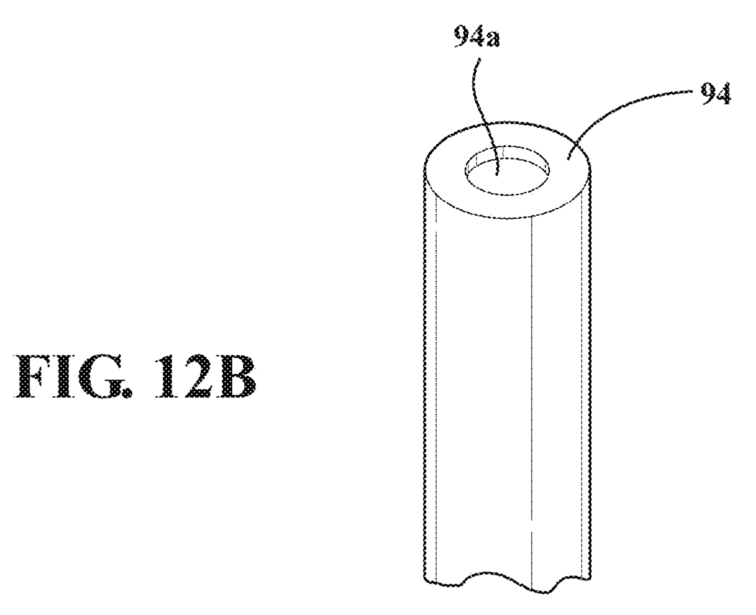
FIG. 12B is partial enlarge perspective view of a top end of a clamping pin from FIG. 12A.

FIG. 12A is an exemplary moving plate 86. The moving plate 86, also known as a pin tower, includes a plate base 86*a* and a plurality of clamping pins 94 extended downwardly from the bottom surface of the plate base 86*a*. The plate base 86*a* may be a rectangular plate. In some examples, the clamping pins 94 may be elongated cylinders. As illustrated in FIG. 12B, the central portion of the top end of the clamping pin 94 has a cylindrical recess 94*a* for removably engaging the top portion 88*b* of the pin 88 on the bowl 82 to retain a mat, such as a Molex™ mat, between the pin 88 and the clamping pin 94. In one example, the depth of the cylindrical recess 94*a* is about 0.5 mm.

Figure 13A:
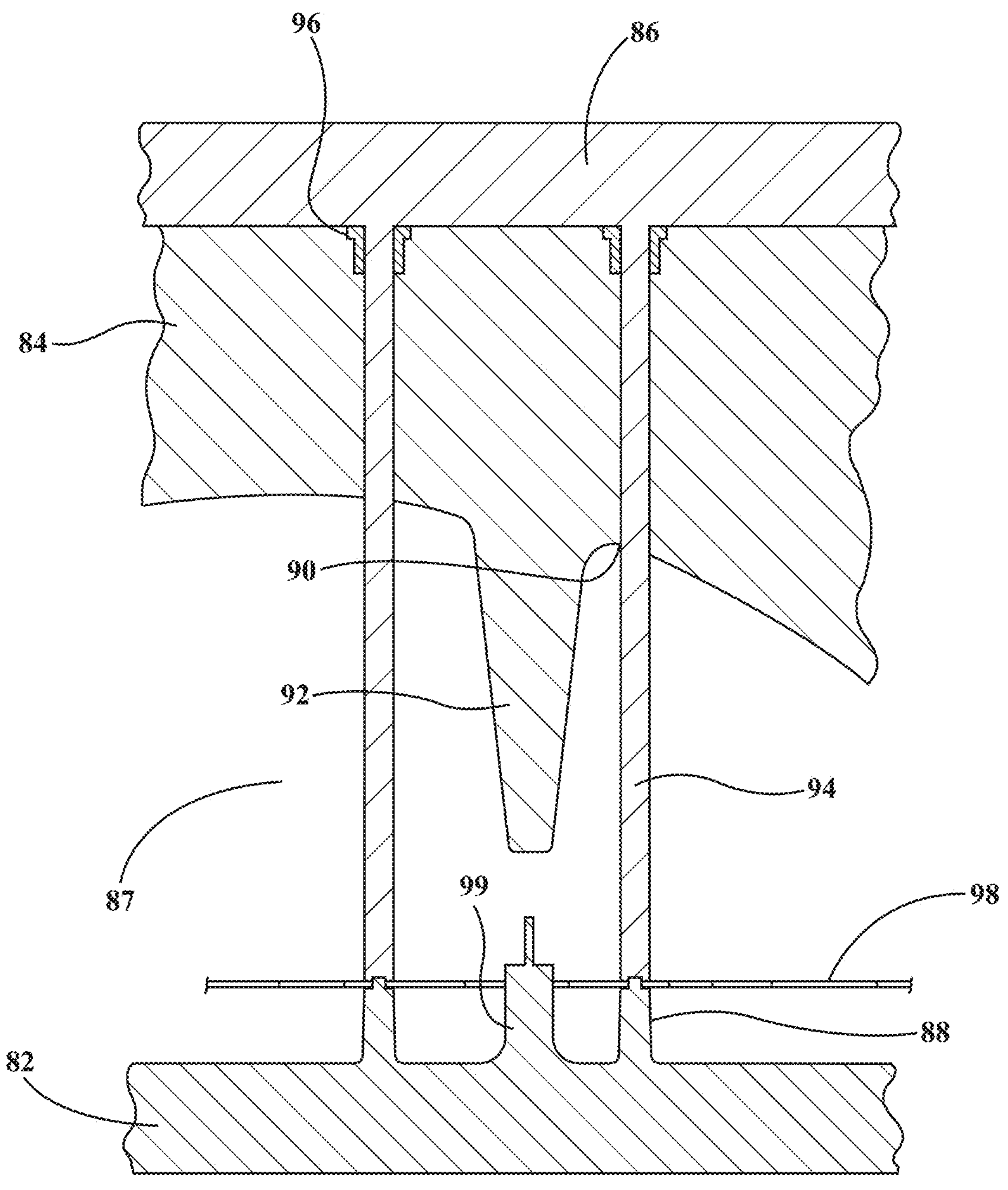
FIG. 13A is a partial cross-sectional view of the tool in FIG. 8, with the mat secured inside the tool.
Figure 13B:
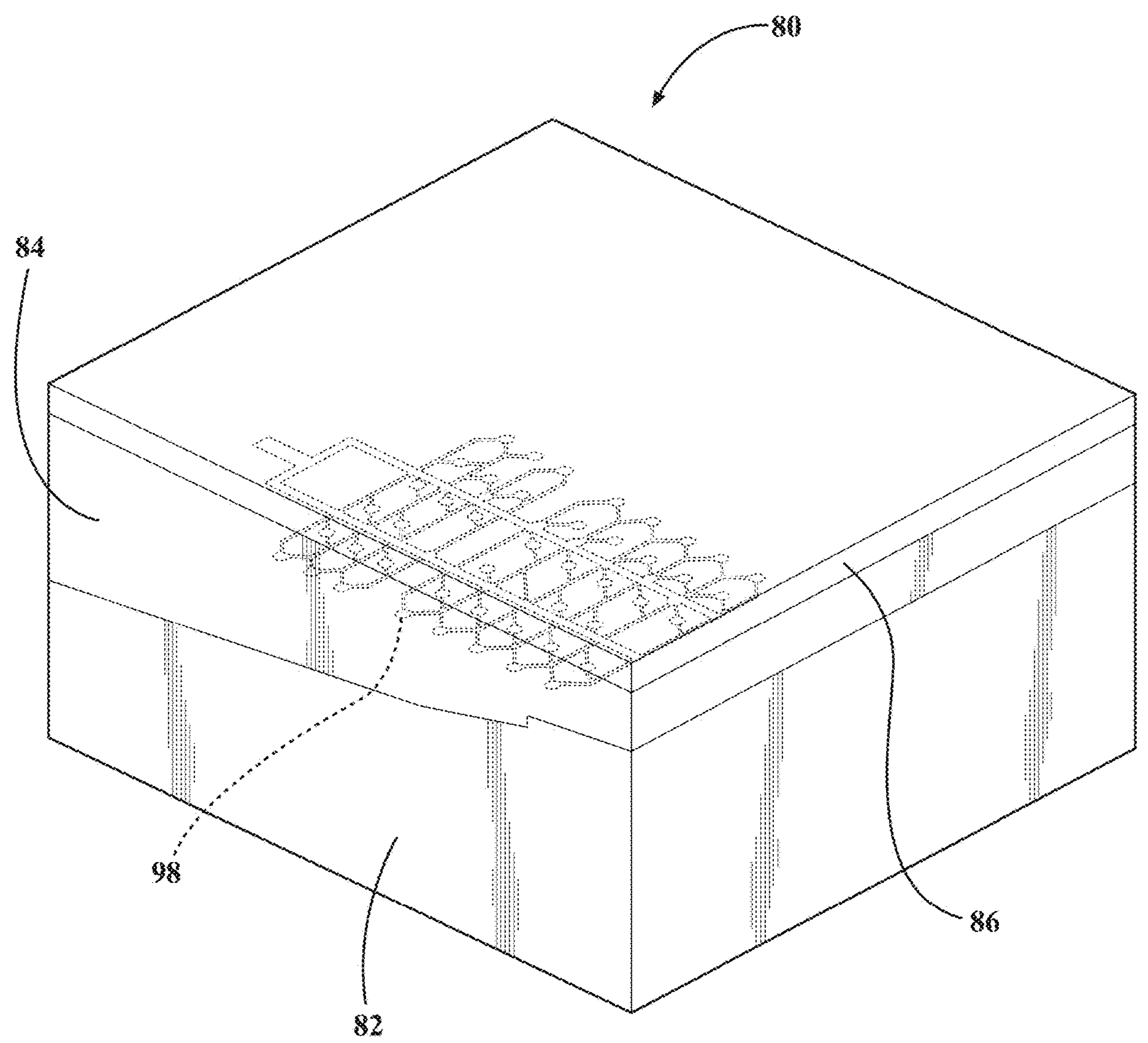
FIG. 13B is a perspective view of the tool in FIG. 8, with the mat secured inside the tool.

The clamping pins 94 are configured to penetrate through the corresponding through holes 90 on the body portion of the lid 84 and to engage the corresponding pins 88 of the bowl 82 when the bottom surface of the plate base 86*a* is placed on the top surface of the lid 84 and when the lid 84 is closed on the bowl 82. In the examples of FIGS. 13A and 13B, the lid 84 is closed on the bowl 82, and the clamping pins 94 of the movable plate 86 penetrate, via the bushings 96, the through holes 90 and clamp the mat 98, such as a Molex™ mat, on the pins 88 by engaging the top portion 88*b* of the pins 88 with the cylindrical recess 94*a* of the clamping pins 94. This position is referred herein as the "closed position" of the tool 80. For example, 15 clamping pins 94 of the movable plate 86 penetrate, via the corresponding respective 15 bushings 96, the corresponding respective 15 through holes 90 and clamp the mat 98, such as a Molex™ mat, on the corresponding respective 15 pins 88 by engaging the 15 top portions 88*b* of the pins 88 with the corresponding respective 15 the cylindrical recesses 94*a* of the clamping pins 94. As such, the mat 98 is securely retained at a predetermined position between the clamping pins 94 and the pins 88 in space 87 inside the tool 80. The tool 80 in a closed position is liquid leakage-proof.

The conical cylinder 92 on the lid 84 downwardly faces the protrusion 99 of the bowl 82. The conical cylinders 92 provide trenches in the bottom of the cushion foam 100 while the protrusions 99 provide trenches in the top of the cushion foam 100 to allow assembly and attachment of a trim cover (not shown) via hog-rings, as is well known in the seating industry.

The shape and dimensions of the bowl 82, the lid 84, and the moving plate 86, including the pin 88, the through hole 90, and the clamping pins 94, may be varied so long as when the lid 84 is closed on bowl 82 (*i*) the bowl 82 and the lid 84 form a space 87 for forming a cushion foam 100 with desired profile; (ii) the mat 98 is fixed at a predetermined position at a predetermined height above the top surface of the bowl 82, and (iii) the bowl 82 and lid 84 form a liquid leakage-proof space 87.

When the tool 80 is closed, the output end 81 (FIG. 8) of the sensor 72 or 74, or of a sensor formed by any flexible printed circuit 26, extends outside the tool 80 between the top surface of the side wall 82*b* of the bowl and bottom surface of the side wall 84*b* of the lid 84. When manufacturing a cushion pad, the liquid cushion foam, such as liquid PU foam and/or liquid electrically conductive foam, may be injected, such as via a nozzle, into the space 87 and onto and around the mat 98, such as a Molex™ mat. The liquid foam injected inside the space 87 cannot leak outside the tool 80 when the tool 87 is in a closed position. The injected liquid foam generally expands within the space 87 in five to ten seconds after the liquid foam is injected in the tool 80. The expanded foam is then cured in the tool 80. Air within the tool space 87 is vented out of the tool as the liquid foam expands and cures, as is commonly known in the foaming industry.

After the cushion foam 100 is fully cured, the mat 98 is now insert-molded inside the cushion foam 100. FIGS. 14A-14C illustrate the process of removing the cured cushion foam 100 from the tool 80. In FIG. 14A, the tool 80 remains in the closed position until the cushion foam 100 is expanded and fully cured in the space 87. To remove the cured cushion foam 100 from the tool 80, in the example shown in FIG. 14B, the moving plate 86 is pulled up, for example, for about 98 mm, from the top surface of the lid 84 to allow the clamping pins 94 to fully disengage the B-side of the cushion foam 100. As illustrated in FIG. 14C, the lid 84 can then be opened up from the bowl 82, and the cushion foam 100 may then be removed from the bowl 82 with the mat 98 molded inside the seat cushion foam 100.

Because the mat 98 is insert-molded inside the seat cushion foam 100 to form an integrated part, when an occupant sits on the seat cushion foam 100, relative movement between the flexible printed circuit 26 and other foam layers, or abrasion between the flexible printed circuit 26 and the surrounding foam, is eliminated or substantially reduced. Therefore, mechanical stresses, creasing, and excessive aging of the flexible printed circuit 26 is reduced.

Certain adaptations and modifications of the described embodiments can be made. Therefore, the above discussed embodiments are considered to be illustrative and not restrictive.

The invention claimed is:

1. A seat cushion comprising:

a polyurethane (PU) foam pad, a pressure sensing system placed on top of the PU foam pad, the pressure sensing system comprising:

a flexible printed circuit comprising:

a flexible substrate; and

N horizontal sensing wires and M vertical sensing wires securely placed on a top surface of the flexible substrate, wherein the N horizontal sensing wires intersect and electrically connect with the M vertical sensing wires and form (N×M) intersections wherein each one of the (N×M) intersections electrically connects one of the N horizontal sensing wires and one of the M vertical sensing wires; and a layer of an electrically conductive foam placed on top of the N horizontal sensing wires and the M vertical sensing wires and operatively connected with the N horizontal sensing wires and the M vertical sensing wires, wherein when an occupant sits on the seat cushion, a pressure is applied to the layer of the electrically conductive foam, each intersection between the electrically connected N horizontal sensing wires and M vertical sensing wires generates in real time an electric flux density value to reflect a degree of a compression caused by the pressure to a corresponding point of the electrically conductive foam.

2. The seat cushion of claim 1, further comprising an electronic control unit configured to receive the electric flux density value from each intersection of the flexible printed circuit and to derive a weight group of the occupant.

3. The seat cushion of claim 1, further comprising a PU foam slab placed on top of the layer of the electrically conductive foam.

4. The seat cushion of claim 1, wherein the flexible printed circuit is between the polyurethane (PU) foam pad and the layer of the electrically conductive foam.

5. The seat cushion of claim 1, wherein the flexible printed circuit is insert-molded inside the polyurethane (PU) foam pad or the layer of the electrically conductive foam.

6. The seat cushion of claim 1, wherein the seat cushion is an automotive seat cushion.

* * * * *